United States Patent
Münker et al.

(10) Patent No.: US 7,199,672 B2
(45) Date of Patent: Apr. 3, 2007

(54) PHASE-LOCKED LOOP WITH A PULSE GENERATOR, AND METHOD FOR OPERATING THE PHASE-LOCKED LOOP

(75) Inventors: Christian Münker, München (DE); Markus Scholz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/127,621

(22) Filed: May 12, 2005

(65) Prior Publication Data
US 2005/0264367 A1 Dec. 1, 2005

Related U.S. Application Data

(63) Continuation of application No. PCT/DE03/03749, filed on Nov. 12, 2003.

(30) Foreign Application Priority Data
Nov. 26, 2002 (DE) .............................. 102 55 099

(51) Int. Cl.
*H03L 7/00* (2006.01)
(52) U.S. Cl. .......................................... 331/16; 331/25
(58) Field of Classification Search ................ 331/16, 331/25
See application file for complete search history.

(56) References Cited

U.S. PATENT DOCUMENTS

| | | | |
|---|---|---|---|
| 4,105,948 A | 8/1978 | Wolkstein | |
| 4,926,141 A | 5/1990 | Herold et al. | |
| 5,304,956 A * | 4/1994 | Egan | 331/10 |
| 5,512,860 A | 4/1996 | Huscroft et al. | |
| 6,121,844 A | 9/2000 | Suzuki | |
| 6,621,354 B1 * | 9/2003 | Kornblum et al. | 331/14 |
| 6,624,852 B1 | 9/2003 | Han | |
| 2002/0048338 A1 | 4/2002 | Ohishi | |
| 2005/0073369 A1 * | 4/2005 | Balboni et al. | 331/16 |

FOREIGN PATENT DOCUMENTS

| | | |
|---|---|---|
| DE | 41 04 040 C2 | 8/1992 |
| EP | 0 115 326 A2 | 8/1984 |
| JP | 10-173521 | 6/1998 |
| KR | 2001-0028138 | 4/2001 |

OTHER PUBLICATIONS

International Search Report, Int'l Application No. PCT/DE03/03749, Int'l Filing Date Nov. 12, 2003, 3 pgs.

* cited by examiner

*Primary Examiner*—Joseph Chang
(74) *Attorney, Agent, or Firm*—Eschweiler & Associates, LLC

(57) ABSTRACT

The phase-locked loop has a pulse generator has a phase detector which is intended to compare a reference signal with an oscillator signal, and a detector output for tapping off a phase comparison signal. The pulse generator is used to produce a pulse-width-modulated pulse signal and has a generator output, from which the pulse-width-modulated pulse signal is tapped off. A selection unit is furthermore provided and is connected, on the input side, to the detector output and to the generator output, and is designed in such a manner that either the phase comparison signal or the pulse signal can be tapped off from an output of the selection unit using a control signal applied to a control input of the selection unit.

14 Claims, 3 Drawing Sheets

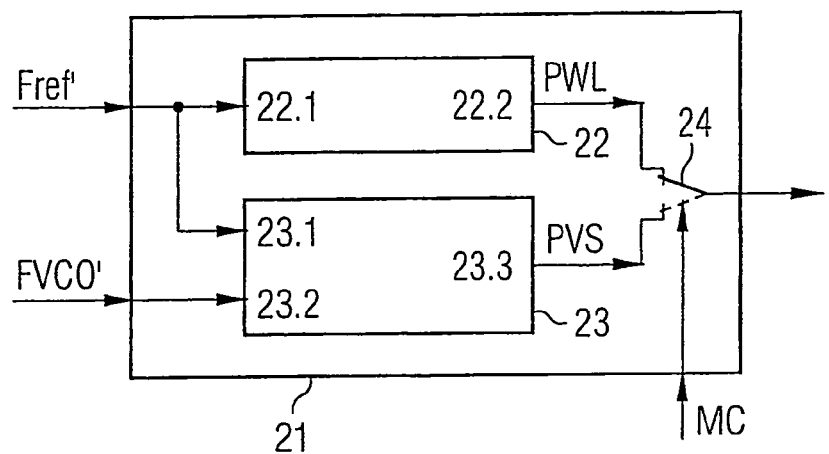
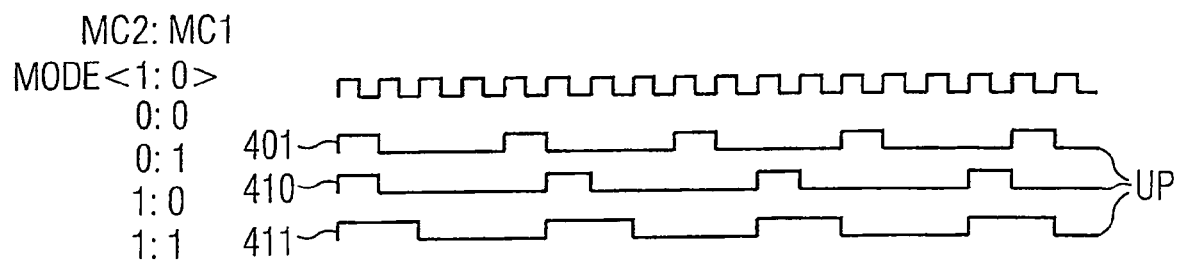

PHASE-LOCKED LOOP WITH A PULSE GENERATOR, AND METHOD FOR OPERATING THE PHASE-LOCKED LOOP

REFERENCE TO RELATED APPLICATIONS

This application is a continuation of PCT/DE03/03749, filed Nov. 12, 2003 which was not published in English, that claims the benefit of the priority date of German Patent Application No. DE 102 55 099.9, filed on Nov. 26, 2002, the contents of which both are herein incorporated by reference in their entireties.

FIELD OF THE INVENTION

The invention relates to a phase-locked loop with a pulse generator, and to a method for operating the phase-locked loop.

BACKGROUND OF THE INVENTION

A phase-locked loop (PLL), which is also referred to as tracking synchronization below, is used to set a frequency (which has been produced by an oscillator) in such a manner that it matches a reference frequency produced by a reference oscillator. The match must be so accurate that the phase shift between the two frequencies does not drift.

FIG. 1 shows the basic configuration of a phase-locked loop as is known from the prior art. A signal (which has been produced by a reference oscillator 1) at a reference frequency Fref is passed to a 1/R divider 2 which divides the reference frequency Fref by the divisor value R and produces a signal at the frequency Fref' (which has been divided by R) at the output. A phase detector 3 is used to compare the signal at the frequency Fref' with a signal at the frequency FVCO'. To this end, the two signals Fref' and FVCO' are passed to the phase detector inputs 3.1 and 3.2 of the phase detector 3. At its output 3.3, the phase detector 3 provides an output voltage which is determined by the phase shift between the signal at the frequency FVCO' (also referred to as the tracking signal below) and the reference signal at the frequency Fref'. A charge pump 4 is connected downstream of the phase detector 3, so that, by means of a control input 4.1 of the charge pump 4, the charge pump 4 can be used to produce a charge pump current Icp at the output 4.2 of the charge pump 4 using the output voltage produced by the phase detector 3. The charge pump current Icp is passed to the input 5.1 of a loop filter 5. The voltage Vtune (also referred to as the tuning voltage below) produced at the output 5.2 of the loop filter 5 is passed to the input 6.1 of a voltage-controlled oscillator 6 in order to set the output frequency FVCO of the voltage-controlled oscillator (VCO) 6. The output signal from the voltage-controlled oscillator 6 at the frequency FVCO is passed, via a feedback path, to a 1/N divider 7 which divides the frequency FVCO to form a frequency FVCO' (which has been divided by the divisor value N) and, as mentioned, passes it to the input 3.2 of the phase detector 3.

If the frequency FVCO differs from the reference frequency Fref, the phase shift increases in proportion to time. Even in the case of finite control gain, this results in the control error in the closed control loop increasing to such an extent that the two frequencies Fref' and FVCO' match exactly. The remaining control error in the frequency thus tends to zero.

If the phase-locked loop PLL is used in a transmitter, a power amplifier 8 may be connected downstream of the output 6.2 of the voltage-controlled oscillator 6 in order to amplify the signal and pass it to an antenna 9. Depending on the application, the 1/N divider 7 may also comprise a radio-frequency initial divider in the form of a fixed-modulus, dual-modulus or multimodulus radio-frequency divider.

The basic configuration of the phase-locked loop shown in FIG. 1 may be used, for example, in a frequency synthesizer.

In this case, a low-frequency, low-noise reference oscillator is first of all needed, as the reference oscillator 1, to produce a radio-frequency carrier frequency FVCO that has as little noise as possible. The 1/R divider 2 (which is referred to as the reference divider below) is used to divide the reference frequency Fref produced by said oscillator to form a lower frequency Fref', the so-called comparison frequency. The 1/N divider is used to divide the radio-frequency output frequency FVCO of the voltage-controlled oscillator 6 to form the lower frequency FVCO'. The phase difference between the two frequencies Fref' and FVCO' is determined using the phase detector 3 and is converted to a signal having a corresponding duty ratio. A pulse-width-modulated signal is then applied to the output 3.3 of the phase detector 3. The charge pump 4 evaluates the duty ratio of the pulse-width-modulated signal and, in conjunction with the loop filter 5, converts the pulse-width-modulated signal to the control voltage Vtune which then controls the voltage-controlled oscillator 6.

The loop filter 5 may be in the form of an active or passive loop filter. In addition, depending on the technical boundary conditions required, the loop filter 5 may be implemented in the form of an integrating or non-integrating loop filter. If the loop filter 5 is in the form of a non-integrating loop filter, only the control difference between the two frequencies Fref' and FVCO' is regulated to zero. A phase control error may remain, however. If the phase shift is likewise intended to be minimized, it is advantageous for the loop filter 5 to be in the form of an integrating filter.

In order to implement certain phase-control systems, it may be necessary to interrupt the phase-locked loop in order to produce one or more specific fixed tuning voltages and thus specific fixed VCO frequencies FVCO.

However, interrupting the phase-locked loop, together with producing a fixed VCO frequency, cannot be readily achieved. Intervention upstream or downstream of the loop filter 5 thus results in an additional parasitic load on the circuit. This in turn leads to additional degeneration as regards the phase noise and to an increase in interference lines (which are also referred to as spurious). Modifying the phase detector also results in similar problems.

In principle, it must be ensured, when modifying the phase-locked loop in any way, that the phase noise does not increase by deliberately controlling the edge gradient and restricting the number of circuit blocks used.

In addition, it is important that the various fixed tuning voltages correlate with one another linearly, which is also referred to as matching. If non-linearities were to occur even when producing the various tuning voltages, additional errors would be generated in a circuit which detects and assesses the gradient of the voltage-controlled oscillator.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof.

Rather, the primary purpose of the summary is to present one or more concepts of the invention in a simplified form as a prelude to the more detailed description that is presented later.

The invention is directed to a phase-locked loop with a pulse generator, and a method for operating the phase-locked loop, in which the phase noise in the phase-locked loop is not increased during the production of various fixed tuning voltages, and the various fixed tuning voltages correlate linearly.

The inventive phase-locked loop with a pulse generator includes a phase detector for comparing a reference signal with an oscillator signal and for producing a phase comparison signal, in which case it is possible to tap off the phase comparison signal from a detector output of the phase detector. The pulse generator is used to produce a pulse-width-modulated pulse signal and has a generator output, from which the pulse-width-modulated pulse signal can be tapped off. A selection unit is furthermore provided and is connected, on the input side, to the detector output and to the generator output, and is designed in such a manner that either the phase comparison signal or the pulse signal can be tapped off from an output of the selection unit using a control signal applied to a control input of the selection unit.

In the inventive method for operating the phase-locked loop, control bits are used to activate the phase detector or the pulse generator.

One embodiment of the invention provides a multiplexer which is connected upstream of the phase detector and has a first and a second multiplexer input, to which the reference signal and the oscillator signal can be applied.

A charge pump which is connected downstream of the selection unit is advantageously provided in the inventive phase-locked loop. The charge pump is used to convert the signal which has been produced by the selection unit to a corresponding charge pump current.

One embodiment of the inventive phase-locked loop provides a loop filter which is connected downstream of the charge pump. This makes it possible to suppress interfering signal components in the control loop. In the open-loop mode, that is to say when the control loop is open, the loop filter is used to generate an average voltage from the pulse signal produced by the pulse generator.

In one embodiment of the inventive phase-locked loop, the phase detector is in the form of a type-4 phase detector. A phase detector such as this has the advantage that it can also be used to detect an error in the frequency in addition to the phase error.

Moreover, in one embodiment of the inventive phase-locked loop, the pulse generator comprises a multimodulus divider. A divider such as this has the advantage that it can be configured in a simple manner, and that the division ratio can be set in accordance with requirements.

In another embodiment of the invention, the pulse generator in the phase-locked loop produces a duty ratio of 1:3, 1:4 or 2:3.

In another embodiment of the inventive method for operating the phase-locked loop, the control bits are used to set the pulse-width ratio of the pulse signal.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail below using four figures.

FIG. 2 is a block diagram illustrating a pulse generator, a phase detector and a selection unit in accordance with one exemplary embodiment of the invention.

FIG. 4 is a timing diagram illustrating a plurality of possible pulse-width-modulated signals produced by the pulse generator in one embodiment of the invention.

DETAILED DESCRIPTION OF THE INVENTION

Figure 1:
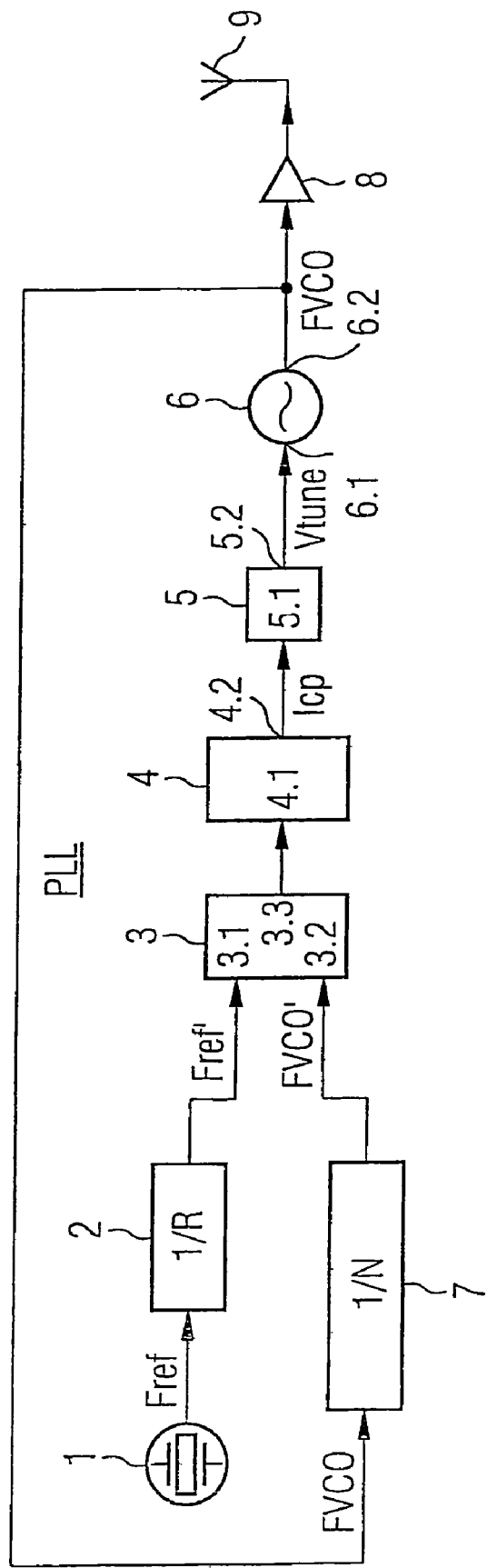
FIG. 1 is a block diagram illustrating a phase-locked loop according to the prior art.

FIG. 1 will not be described in any more detail below, since it has already been described in the introduction to the description. Reference is made to the text above in order to explain FIG. 1.

The block diagram shown in FIG. 2 shows a pulse generator 22, a phase detector 23 and a selection unit 24, which have been combined by means of the block that has been summarized using the reference symbol 21 in the present example. The pulse generator 22 has a generator input 22.1, to which the reference signal Fref' can be applied. A pulse-width-modulated signal PWL which has been produced by the pulse generator 22 can be tapped off from the generator output 22.2. The reference signal Fref' is simultaneously passed to the first input 23.1 of the phase detector 23 in order to be compared with the oscillator signal FVCO' which has been applied to the second input 23.2 of the phase detector 23. The result of the comparison can then be tapped off, as the phase comparison signal PVS, from the detector output 23.3. Both the phase comparison signal PVS and the pulse-width-modulated pulse signal PWL are passed to a selection unit 24 which, for the sake of simplicity, is shown as a controllable switch in FIG. 2. A control signal MC which controls the selection unit 24 is used to determine whether the pulse-width-modulated pulse signal PWL or the phase comparison signal PVS is to be switched to the output of the selection unit 24.

Replacing the phase detector 3 in the phase-locked loop PLL shown in FIG. 1 with the block 21 shown in FIG. 2 results in a phase-locked loop which, depending on requirements, is used either to match the oscillator frequency FVCO to the reference frequency Fref or to produce a specific fixed tuning voltage Vtune and thus a specific fixed oscillator frequency FVCO.

Figure 3:
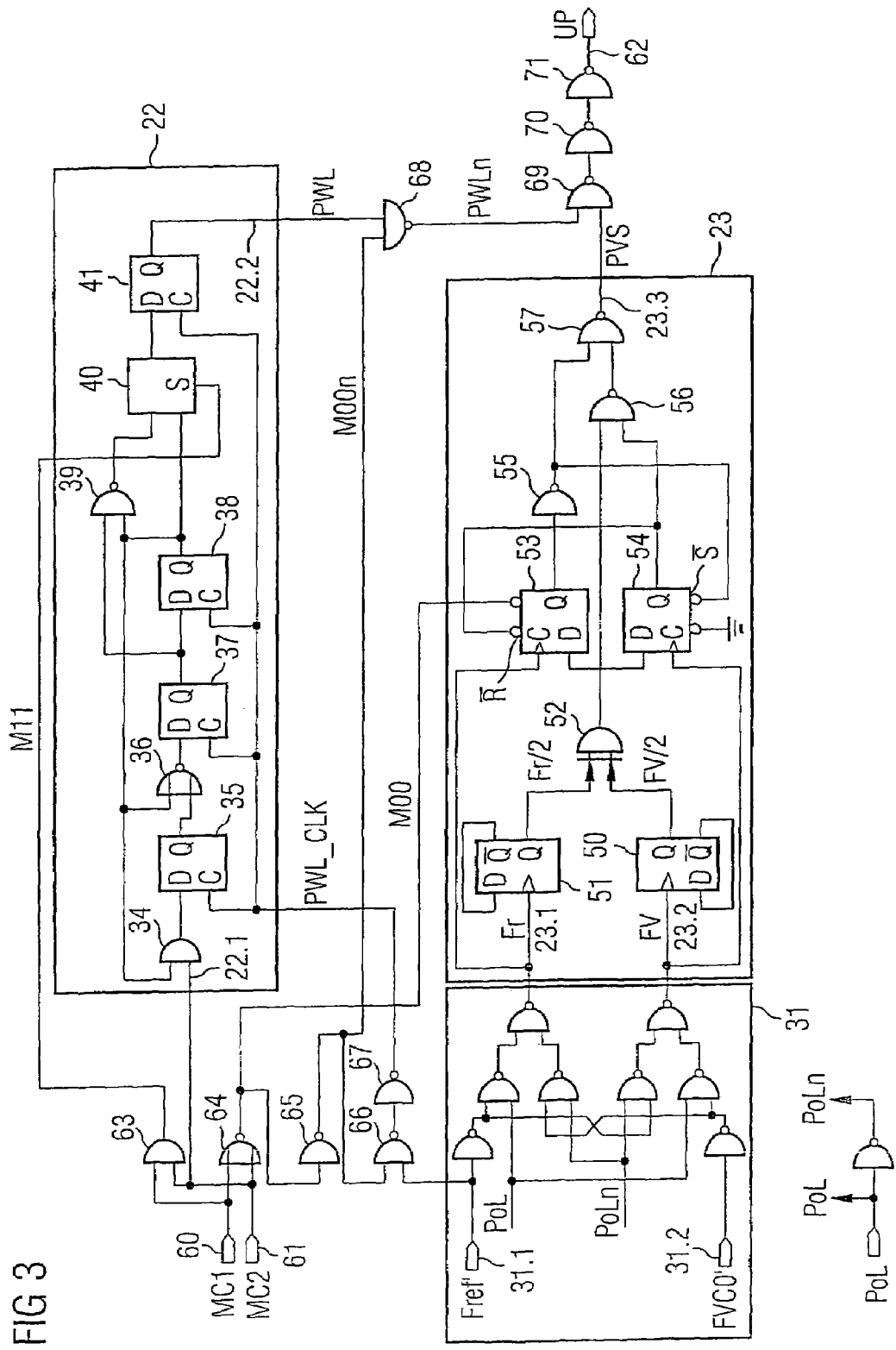
FIG. 3 is a circuit diagram illustrating one exemplary embodiment of the pulse generator, the phase detector and the selection unit of the present invention.

FIG. 3 shows, in the form of a circuit diagram, one possible embodiment of the block 21 shown in FIG. 2. The control bits MC1 and MC2 which are applied to the inputs 60 and 61 of the selection unit 24 can be used, on the one hand, to select whether the pulse generator 22 or the phase detector 23 is to be activated in conjunction with a multiplexer 31. In addition, the two control bits MC1 and MC2 can be used to prescribe the pulse-width ratio of the pulse-width-modulated signal PWL produced by the pulse generator 22.

The pulse generator 22 is in the form of a multimodulus divider in FIG. 3. In this case, it is a synchronous divider comprising an AND gate 34, a first flip-flop 35, a NOR gate 36, a second flip-flop 37 and a third flip-flop 38. A multiplexer 40 and a fourth flip-flop 41 are connected downstream of the synchronous divider. Depending on the operating mode selected, the multiplexer 40 can either forward the signal from the AND gate 39 or the divider signal from the third flip-flop 38 to the multiplexer output and thus to the input D of the fourth flip-flop 41. Resynchronization with the input clock PWL_CLK is effected with the aid of the fourth flip-flop 41. Resynchronization is used to avoid sudden phase changes which are caused by changing between the various possible operating modes.

If the signal M00n at the NAND gate 68 has the logic state 1, the pulse signal PWL is passed on to the NAND gate 69. It is applied to the latter in the form of an inverted pulse signal PWLn.

In addition, the multimodulus divider is able to double the pulse width in that mode which divides by the value 5. In FIG. 4, this corresponds to the signal profile 411 belonging to the mode 1:1.

The input clock PWL_CLK corresponds to the reference signal at the reference frequency Fref' if the reference signal is passed on using the NOR gate 64, the inverter 65 and the NAND gate 66. This is the case, for example, when the two control bits MC1 and MC2 each assume the logic state 1.

In the exemplary embodiment shown in FIG. 3, a type-4 phase detector is used as the phase detector 23. Generally speaking, this is a phase detector which uses feedback flip-flops. A type-4 phase detector can be used to detect both a phase error and a frequency error in the range of +/−2π=360 degrees. The two flip-flops 50 and 51 in the phase detector 23 divide each of the two input signals Fr and FV by two and pass the divided signals Fr/2 and FV/2 to the two inputs of an XOR gate 52. The XOR gate 52 forms the actual phase detector. The frequency detector is formed by the two flip-flops 53 and 54 which are connected downstream of the XOR gate 52 and whose two clock inputs C are connected to the two input signals Fr and FV. The outputs Q of the two flip-flops 53 and 54 and thus of the frequency detector are linked to one another via the inverter 55 and the two NAND gates 56 and 57. The output of the NAND gate 57 simultaneously forms the output 23.3 of the entire phase detector 23.

If the two control bits MC1 and MC2 each contain the value 0, the phase detector 23 is activated via the control input of the flip-flop 53. In contrast, the pulse generator 22 is deactivated. In this case, the phase comparison signal PVS which is applied to the output 23.3 of the phase detector 23 is switched to the output 62 of the circuit as the signal UP.

As is shown in the embodiment in FIG. 3, a multiplexer 31 may be connected upstream of the two detector inputs 23.1 and 23.2. However, this is not absolutely necessary. Depending on a control signal POL or POLn, the signals Fref' and FVCO' which are applied to the multiplexer inputs 31.1 and 31.2 of the multiplexer 31 are switched to the two detector inputs 23.1 and 23.2 of the phase detector 23. In this case, the control signal POLn is obtained from the control signal POL using an inverter and thus constitutes the inverted control signal POL.

FIG. 4 shows four signal profiles, with the signal profile shown at the very top representing the profile of the reference signal at the reference frequency Fref'. If the two control bits MC1 and MC2 have the value 0, no pulse signal PWL is applied to the output 22.2 of the pulse generator 22. The signal UP, the phase comparison signal PVS from the phase detector 23, is then at the output 62 and thus corresponds to the phase difference between the reference signal Fref and the oscillator signal FVCO. If, in contrast, the control bit MC1=1 and the control bit MC2=0, the signal profile labeled 401 results for the signal UP. In this case, the pulse generator 22 is active and generates the pulse-width-modulated pulse signal PWL having a duty ratio of 1:3, which signal then appears at the output 62 as the signal UP. If the circuit is in mode 1:0, that is to say if the control bit MC1 has the value 0 and the control bit MC2 has the value 1, the signal profile which is labeled with the reference symbol 410 and has a duty ratio of 1:4 results for the signal UP at the output 62. If, finally, the circuit is in mode 1:1, that is to say the control bit MC1=1 and also the control bit MC2=1, the pulse generator 22 produces a pulse signal PWL having a duty ratio of 2:3, which signal is applied to the output 62 as the signal UP and corresponds to the profile labeled with the reference symbol 411. In the example in FIG. 4, the reference frequency Fref' is selected to be Fref'=26 MHz.

Therefore, the phase detector 23 is active only in mode 0:0, and the phase-locked loop is closed. In all other cases, the phase detector 23 is deactivated, and the two control bits MC1 and MC2 are used both to activate the pulse generator 22 and to prescribe the pulse-width ratio, as is shown in FIG. 4 for the signal profiles 401, 410 and 411. All of the pulse-width-modulated signals PWL which are produced by the pulse generator 22 are formed by the generator 22 on the basis of the reference signal Fref'. The phase-locked loop is then in the open-loop mode. The open-loop mode corresponds to the open control loop. The embodiment shown in FIG. 3 can be used to implement three different pulse-width ratios, namely a pulse-width ratio of 1:3 in mode 0:1, a pulse-width ratio of 1:4 in mode 1:0 and a pulse-width ratio of 2:3 in mode 1:1. Three different fixed tuning voltages Vtune, namely 250 mV, 200 mV and 400 mV, are thus provided at the output 5.2 of the charge pump 5. Three different fixed oscillator frequencies FVCO are thus in turn produced at the output 6.2 of the voltage-controlled oscillator 6.

The inventive phase-locked loop with a pulse generator thus makes it possible to rapidly change in a digital manner between an open and a closed control loop, for example for a frequency synthesizer. The invention also has the advantage that it can be used to produce various defined tuning voltages Vtune in the open-loop mode. A further advantage is that the tuning voltage Vtune can be produced using the loop filter 5 without additional components. The tuning voltages Vtune are produced exclusively using variables which are also used in the closed-loop mode, namely using the reference frequency Fref', the duty ratio which can be set digitally and the lower and upper output voltages VHi and VLo of the phase detector 23, or using the output current Icp of the charge pump 4 and the resistance of the loop filter 5. A further advantage of the inventive phase-locked loop with a pulse generator is finally that the fixed tuning voltages Vtune which are produced are very linear with respect to one another. Despite interfering with the phase-locked loop, the phase noise is not increased in the closed-loop mode.

Another phase detector may also be used instead of the phase detector 23 shown in FIG. 3.

The invention is not restricted to the pulse generator 22 shown in FIG. 3 either. A pulse generator which produces a duty ratio other than 1:3, 1:4 or 2:3 can also be used instead of the pulse generator 22 described. A fractional-N controller also enables very finely graduated duty ratios.

The pulse generator 22 for producing the pulse-width-modulated signal PWL can be fitted both inside and outside the phase detector 23.

A solution which is intrinsic to the phase detector and sets the tuning voltage Vtune "digitally" on the basis of the reference frequency Fref' is implemented in one embodiment of the present invention. Using the signal source which has the least amount of noise in the system, namely the reference oscillator which produces the reference frequency Fref, makes it possible to keep the phase noise extremely low. The phase noise does not increase in comparison to a phase-locked loop without a pulse generator.

After the operating mode has been selected using the control signal MC, the circuit operates either as a phase detector in the closed-loop mode or as a pulse-width generator in the open-loop mode.

In the closed-loop mode, the phase detector produces output pulses at the reference frequency Fref'. For stable operation of the phase-locked loop PLL, the loop filter 5 is designed in such a manner that the reference frequency Fref' is sufficiently filtered out. In the open-loop mode, this property of the loop filter 5 can be used to convert the pulse-width-modulated signal PWL from the pulse generator 22 to an average DC voltage VAvg whose magnitude is proportional to the duty ratio of the pulse-width-modulated signal PWL.

The magnitude of the average DC voltage VAvg is given by:

$$VAvg = VHi \cdot \frac{THi}{TRef} + VLo \cdot \frac{TLo}{TRef}$$

where

VHi is the output level in the high state,

VLo is the output level in the low state,

THi is the high phase,

TLo is the low phase, and

TRef is the period.

The following applies to the examples of pulse-width-modulated signals PWL shown in FIG. 4: VHi=1 V and VLo=0 V. The duty ratio (which is also referred to as the duty cycle (DC)) is defined by:

$$DC = \frac{THi}{TLo}$$

The magnitude of the average voltage VAvg is only dependent on the duty ratio DC and on the output levels VHi and VLo of the phase detector 23. The output levels VHi and VLo of the phase detector 23 determine, inter alia, the loop gain of the phase-locked loop PLL. If necessary, the average voltage VAvg can thus be used to adjust the loop gain. The average voltage VAvg can be varied in a highly linear manner by changing the duty ratio DC.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

| List of reference symbols | |
|---|---|
| 1 | Reference oscillator |
| 2 | 1/R divider |
| 3 | Phase detector |
| 3.1 | First input of the phase detector |
| 3.2 | Second input of the phase detector |
| 3.3 | Output of the phase detector |
| 4 | Charge pump |
| 4.1 | Input of the charge pump |
| 4.2 | Output of the charge pump |
| 5 | Loop filter |
| 5.1 | Input of the loop filter |
| 5.2 | Output of the loop filter |
| 6 | Voltage-controlled oscillator |
| 6.1 | VCO input |
| 6.2 | VCO output |
| 7 | 1/N divider |
| 8 | Power amplifier |
| 9 | Antenna |
| 21 | Pulse generator, phase detector, selection unit |
| 22 | Pulse generator |
| 22.1 | Input of the pulse generator |
| 22.2 | Output of the pulse generator |
| 23 | Phase detector |
| 23.1, 23.2 | Inputs of the phase detector |
| 23.3 | Detector output |
| 24 | Selection unit |
| 34 | NAND gate |
| 35 | Flip-flop |
| 36 | OR gate |
| 37 | Flip-flop |
| 38 | Flip-flop |
| 39 | AND gate |
| 40 | Multiplexer |
| 41 | Flip-flop for resynchronization |
| 50 | Flip-flop |
| 51 | Flip-flop |
| 52 | XOR gate |
| 53 | Flip-flop |
| 54 | Flip-flop |
| 55 | Inverter |
| 56 | NAND gate |
| 57 | NAND gate |
| 60 | First control input of the selection unit |
| 61 | Second control input of the selection unit |
| 62 | Output of the selection unit |
| PWL_CLK | Clock for the pulse generator |
| PWL | Pulse-width-modulated pulse signal |
| PWLn | Inverted pulse-width-modulated pulse signal |
| POL | Control signal |
| POLn | Inverted control signal |
| MC, MC1, MC2 | Control bits |
| FVCO | Frequency of the VCO |
| FVCO' | Divided frequency of the VCO |
| Fref | Reference frequency |
| Fref' | Divided reference frequency |
| PLL | Phase-locked loop |
| K | Correction value |

-continued

| List of reference symbols | |
|---|---|
| Vtune | Tuning voltage |
| Icp | Charge pump current |

The invention claimed is:

1. A phase-locked loop, comprising:
a phase detector configured to compare a reference signal with an oscillator signal, and output at a detector output a phase comparison signal based thereon;
a pulse generator having a generator output, and configured to produce a pulse-width-modulated pulse signal thereat, the pulse generator comprising a generator input connected to an input of the phase detector and configured to receive a reference signal thereat; and
a selection unit having a control input, and an output, the selection unit connected, on an input side, to the phase detector output and to the pulse generator output, and configured to pass either the phase comparison signal or, in an operating mode with an open control loop, the pulse-width-modulated pulse signal to the output thereof based on a control signal applied to the control input.

2. The phase-locked loop of claim 1, further comprising a multiplexer connected upstream of the phase detector and comprising a first and a second multiplexer input, to which the reference signal and the oscillator signal are applied, respectively.

3. The phase-locked loop of claim 1, further comprising a charge pump connected downstream of the selection unit and configured to generate a charge pump current based on the output of the selection unit.

4. The phase-locked loop of claim 3, further comprising a loop filter connected downstream of the charge pump, and configured to generate a tuning voltage based on the charge pump current.

5. The phase-locked loop of claim 1, wherein the phase detector is configured to detect a frequency error between the reference signal and the oscillator signal.

6. The phase-locked loop of claim 1, wherein the pulse generator comprises a multimodulus divider.

7. The phase-locked loop of claim 1, wherein the pulse generator is configured to produce the pulse signal having a duty ratio of 1:3, 1:4 or 2:3 based on a state of a control signal.

8. A phase locked loop circuit, comprising:
a voltage controlled oscillator circuit configured to generate an output signal based on a tuning signal applied thereto;
a feedback path configured to generate a feedback signal that is a function of the output signal from the voltage controlled oscillator circuit;
a selectively activatable phase detector system configured to generate a closed-loop control signal in a closed-loop mode that is a function of a comparison between the feedback signal and a reference signal, and generate an open-loop control signal in an open-loop mode that is independent of the comparison; and
wherein the open-loop control signal comprises a pulse-width-modulated pulse signal having a duty cycle that is a function of a state of one or more selection signals.

9. The phase locked loop circuit of claim 8, wherein the voltage controlled oscillator circuit is configured to generate a predetermined fixed frequency output signal based on the duty cycle of the pulse-width-modulated pulse signal in the open-loop mode.

10. A phase locked loop circuit, comprising:
a voltage controlled oscillator circuit configured to generate an output signal based on a tuning signal applied thereto;
a feedback path configured to generate a feedback signal that is a function of the output signal from the voltage controlled oscillator circuit;
a selectively activatable phase detector system configured to generate a closed-loop control signal in a closed-loop mode that is a function of a comparison between the feedback signal and a reference signal, and generate an open-loop control signal in an open-loop mode that is independent of the comparison; and
wherein the selectively activatable phase detector system comprises:
a pulse generator having an input coupled to the reference signal, an output, and configured to generate the open-loop control signal;
a phase detection circuit having a first input coupled to the reference signal and a second input coupled to the feedback signal, and configured to generate the closed-loop control signal based on a phase comparison, a frequency comparison, or both, of the reference and feedback signals; and
a selection circuit configured to selectively pass one of the open-loop control signal and the closed-loop control signal based on a state of one or more selection signals coupled thereto.

11. The phase locked loop circuit of claim 10, wherein the pulse generator is configured to generate the open-loop control signal having a duty cycle that is a function of one or more duty cycle selection signals.

12. The phase locked loop circuit of claim 11, further comprising a loop filter configured to generate the tuning signal having a magnitude that is a function of the duty cycle of the open-loop control signal.

13. A method of operating a phase locked loop circuit in two modes, comprising:
activating a closed-loop phase locked loop mode, wherein an output signal is generated having a frequency that is a function of a comparison between a reference signal and a feedback signal that is related to the output signal;
activating an open-loop phase locked loop mode, wherein the output signal is generated having a frequency that is independent of the comparison;
wherein the activation of the closed-loop mode or the open-loop mode is a function of one or more selection signals;
wherein activating the open-loop phase locked loop mode further comprises generating an open-loop control signal having a duty cycle that is a function of a state of the one or more selection signals; and
generating a voltage controlled oscillator tuning signal based on the duty cycle of the open-loop control signal.

14. The method of claim 13, further comprising generating the output signal based on the voltage controlled oscillator tuning signal.

* * * * *